(12) United States Patent
Fattaruso et al.

(10) Patent No.: US 7,535,280 B2
(45) Date of Patent: May 19, 2009

(54) APPARATUS AND METHOD FOR SHIFTING A SIGNAL FROM A FIRST REFERENCE LEVEL TO A SECOND REFERENCE LEVEL

(75) Inventors: John W. Fattaruso, Dallas, TX (US); Benjamin J. Sheahan, University Park, TX (US)

(73) Assignee: Texas Instruments Incorporated, Dallas, TX (US)

( * ) Notice: Subject to any disclaimer, the term of this patent is extended or adjusted under 35 U.S.C. 154(b) by 538 days.

(21) Appl. No.: 10/836,800

(22) Filed: Apr. 30, 2004

(65) Prior Publication Data

US 2005/0242669 A1 Nov. 3, 2005

(51) Int. Cl.
*H03L 5/00* (2006.01)
(52) U.S. Cl. .............................. 327/333; 326/75; 326/80
(58) Field of Classification Search ................. 327/333; 326/63–81
See application file for complete search history.

(56) References Cited

U.S. PATENT DOCUMENTS

| | | | |
|---|---|---|---|
| 4,618,785 A * | 10/1986 | van Tran | 327/53 |
| 4,629,913 A | 12/1986 | Lechner | |
| 5,162,677 A | 11/1992 | Takahashi | |
| 5,177,379 A | 1/1993 | Masumoto | |
| 5,467,043 A * | 11/1995 | Ohi | 327/333 |
| 5,754,059 A | 5/1998 | Tanghe et al. | |
| 6,084,459 A * | 7/2000 | Jeong | 327/333 |
| 6,686,773 B1* | 2/2004 | Dash et al. | 326/83 |
| 6,856,169 B2 | 2/2005 | Frans et al. | |
| 6,937,065 B2* | 8/2005 | Aoki | 326/81 |
| 6,937,080 B2 | 8/2005 | Hairapetian | |
| 2004/0032291 A1* | 2/2004 | Tseng | 327/333 |
| 2004/0160262 A1* | 8/2004 | Kim et al. | 327/333 |

FOREIGN PATENT DOCUMENTS

JP 06 232730 8/1994

* cited by examiner

*Primary Examiner*—Donovan Lincoln
*Assistant Examiner*—William Hernandez
(74) *Attorney, Agent, or Firm*—John J. Patti; Wade J. Brady, III; Frederick J. Telecky, Jr.

(57) ABSTRACT

An apparatus for shifting a received signal at a first reference level to an output signal at a second reference level; the received signal including information-indicating signal values; includes: (a) an input locus for receiving the received signal; (b) an output locus for presenting the output signal; (c) a first signal-handling circuit coupled with the input locus and with the output locus and setting the second reference level at the output locus; and (d) a second signal-handling circuit coupled with the input locus and with the first signal-handling circuit; the first signal-handling circuit and the second signal-handling circuit cooperating to convey the information-indicating signal values from the input locus to the output locus.

21 Claims, 3 Drawing Sheets

US 7,535,280 B2

APPARATUS AND METHOD FOR SHIFTING A SIGNAL FROM A FIRST REFERENCE LEVEL TO A SECOND REFERENCE LEVEL

BACKGROUND OF THE INVENTION

The present invention is directed to level shifting circuits, and especially to level shifting circuits used for shifting data signals conveying information from a first reference level to a second reference level. Most commonly, the level shifting circuit of the present invention is used to shift data signals from a reference level above ground to a ground reference.

In data communications, it is not uncommon for a manufacturer of a signaling apparatus to specify output signaling to occur relative to a reference level above ground, while downstream apparatuses, especially data transmission apparatuses, require that signaling occur relative to ground for proper operation. There is, therefore, a need for a level shifting apparatus between a data source signal generator and downstream communication apparatuses, such as data transmission apparatuses. As speed of communications (also referred to as speed of operation) for data communication systems has increased, circuitry involved in level shifting operations has had difficulty keeping up. The result has been that level shifting apparatuses have operated as bottlenecks in communication systems and have had the effect of slowing entire systems.

Prior art level shifting circuits have offered unacceptable accuracy because their inability to accommodate power supply voltage variations have resulted in poor control of output signals.

Prior art level shifting circuits have also offered unacceptable accuracy because temperature and process variations in their manufacture have resulted in poor control of output signals.

There is a need for a level shifting circuit that can accommodate power supply voltage variations without sacrificing accuracy of output signals.

There is a need for a level-shifting circuit that can accommodate high speed operations without sacrificing accuracy of output signals.

There is a need for a level-shifting circuit that generates a controlled output signal, even in the presence of temperature and process manufacturing variations.

SUMMARY OF THE INVENTION

An apparatus for shifting a received signal at a first reference level to an output signal at a second reference level; the received signal including information-indicating signal values; includes: (a) an input locus for receiving the received signal; (b) an output locus for presenting the output signal; (c) a first signal-handling circuit coupled with the input locus and with the output locus and setting the second reference level at the output locus; and (d) a second signal-handling circuit coupled with the input locus and with the first signal-handling circuit; the first signal-handling circuit and the second signal-handling circuit cooperating to convey the information-indicating signal values from the input locus to the output locus.

A method for shifting a received signal at a first reference level to an output signal at a second reference level; the received signal including information-indicating signal values; includes the steps of: (a) In no particular order: (1) providing an input locus for receiving the received signal; (2) providing an output locus for presenting the output signal; (3) providing a first signal-handling circuit coupled with the input locus and with the output locus; and (4) providing a second signal-handling circuit coupled with the input locus and with the first signal-handling circuit. (b) Operating the first signal-handling circuit to set the second reference level at the output locus; and (c) Operating the first signal-handling circuit and the second signal-handling circuit cooperatively to convey the information-indicating signal values from the input locus to the output locus.

It is, therefore, an object of the present invention to provide an apparatus and method for shifting a signal from a first reference level to a second reference level that can accommodate power supply voltage variations without sacrificing accuracy of output signals.

It is a further object of the present invention to provide an apparatus and method for shifting a signal from a first reference level to a second reference level that can accommodate high speed operations without sacrificing accuracy of output signals.

It is yet a further object of the present invention to provide an apparatus and method for shifting a signal from a first reference level to a second reference level that generates a controlled output signal, even in the presence of temperature and process manufacturing variations.

Further objects and features of the present invention will be apparent from the following specification and claims when considered in connection with the accompanying drawings, in which like elements are labeled using like reference numerals in the various figures, illustrating the preferred embodiments of the invention.

DETAILED DESCRIPTION OF THE PREFERRED EMBODIMENT

Figure 1:
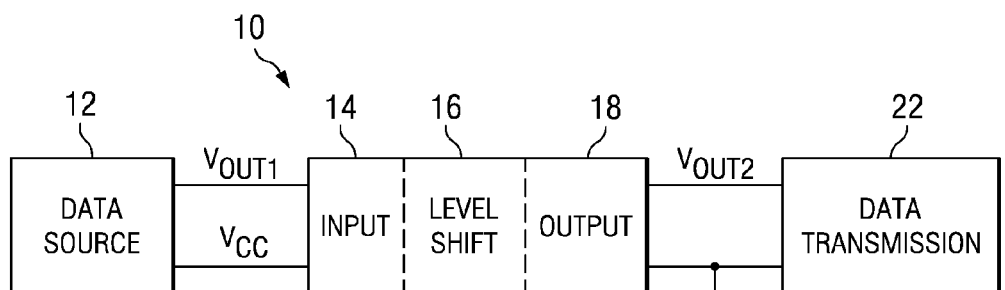
FIG. 1 is a schematic diagram illustrating employment of a level-shifting apparatus in a communication system.

FIG. 1 is a schematic diagram illustrating employment of a level-shifting apparatus in a communication system. In FIG. 1, a data communication system 10 includes a data source 12 from which data signals are transmitted. Data source 12 provides a data signal $V_{OUT1}$ referenced to a reference level $V_{CC}$ to an input section 14 of a level-shifting apparatus 16. Reference level $V_{CC}$ is above ground. Output signal $V_{OUT1}$ is illustrated as a single-ended signal. However, communication signaling is commonly carried out using fully differential signaling in order to reduce the effects of noise in a communication system. The present invention is useful for single-ended communication signaling as well as for fully differential communication signaling.

Level shifting apparatus 16 generates a data signal $V_{OUT2}$ referenced to ground 20 at an output locus 18. Output signal $V_{OUT2}$ is illustrated as a single-ended signal. However, output signal $V_{OUT2}$ may be a fully differential communication signal because, as mentioned earlier, communication signaling is commonly carried out using fully differential signaling. The present invention is useful for single-ended communication signaling as well as for fully differential communication signaling. Output signal $V_{OUT2}$ is communicated to a data transmission apparatus 22 for further treatment in system 10 (not shown in detail in FIG. 1). Either or both of output signals $V_{OUT1}$ $V_{OUT2}$ could be current signals. The point is that signals produced from data source 12 are referenced to a reference level $V_{CC}$ above ground, and signals produced from level-shifting apparatus 16 are referenced to ground.

Figure 2:
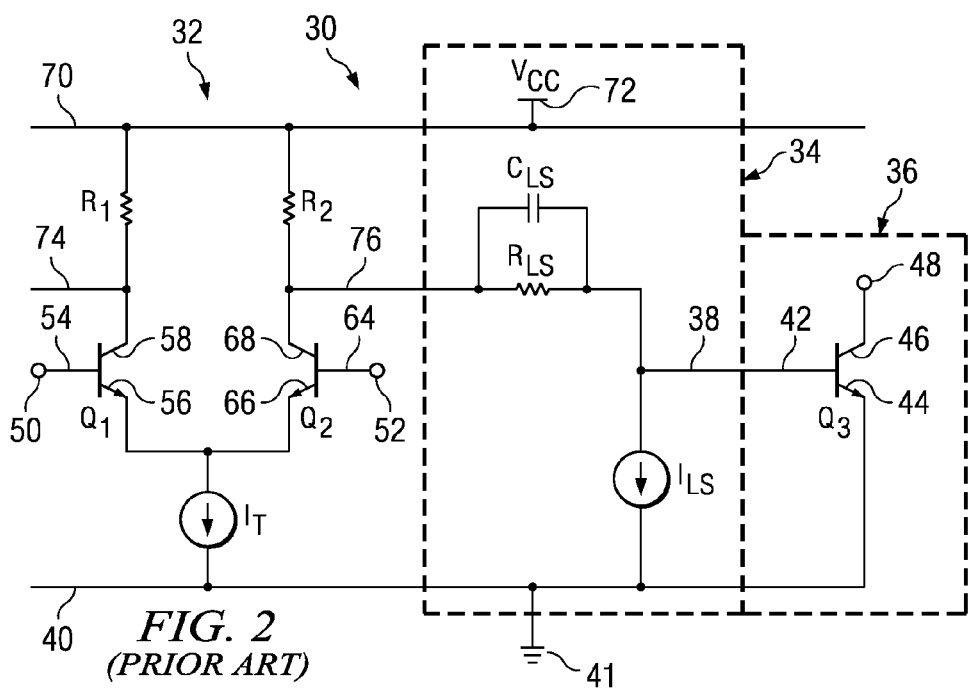
FIG. 2 is an electrical schematic diagram of a representative prior art level-shifting apparatus.

FIG. 2 is an electrical schematic diagram of a representative prior art level-shifting apparatus. In FIG. 2, a level-shifting apparatus 30 includes an input section 32, a level shift section 34 and an output section 36. Signals appearing at an output locus 38 are referenced to ground. Output section 36 may contain any appropriate interface structure for connecting with downstream portions of a communication system. In FIG. 2, output section 36 is representatively illustrated, by way of example and not by way of limitation, as including an NPN bipolar transistor $Q_3$ having a base 42 coupled with output locus 38, an emitter 44 coupled with ground 41 via a lower rail 40 and a collector 46 coupled with an output interface terminal 48 for connecting with downstream portions of a communication system (not shown in FIG. 2).

Fully differential signaling input signals are received by input section 32 from an upstream data source (not shown in FIG. 2; e.g., data source 12; FIG. 1) at input terminals 50, 52. Input terminal 50 is coupled with an NPN bipolar transistor $Q_1$ at its base 54. Transistor $Q_1$ has an emitter 56 and a collector 58. Input terminal 52 is coupled with an NPN bipolar transistor $Q_2$ at its base 64. Transistor $Q_1$ has an emitter 66 and a collector 68. Collector 58 is coupled with an upper rail 70 via a resistor $R_1$. Collector 68 is coupled with upper rail 70 via a resistor $R_2$. Upper rail 70 is coupled with a voltage supply locus 72 providing a supply voltage $V_{CC}$. Emitters 54, 64 are coupled with ground 41 via a current source $I_T$ and lower rail 40. Input section 32 presents output signals at output leads 74, 76.

In the interest of simplifying FIG. 2, apparatus 30 is shown configured for single-ended signaling so that only one side of signaling structure is included in apparatus 30. That is, level shift section 34 and output section 36 are only associated with output lead 76. A similar structure to level shift section 34 and output section 36 would also be coupled with output lead 74 for effecting fully differential signaling using apparatus 30. Operation of the output section and level shift section associated with output lead 74 (not shown in FIG. 2) is substantially identical with operation of output section 36 and level shift section 34 illustrated in coupled relation with output lead 76 and described below.

Level shift section 34 includes a resistor $R_{LS}$ coupled with output lead 76, and a capacitor $C_{LS}$ coupled in parallel with resistor $R_{LS}$. A current source $I_{LS}$ is coupled with resistor $R_{LS}$ and with output locus 38. Current source $I_{LS}$ draws current though resistor $R_{LS}$ to effect a voltage drop across resistor $R_{LS}$ appropriate to establish the desired voltage (referenced to ground 41) at output locus 38.

Signals appearing at output lead 76 are referenced with a reference level above ground (e.g. reference level $V_{CC}$; FIG. 1). Signal variations in signals received at output lead 76, including information indicating signal variations, are conveyed via resistor $R_{LS}$ and capacitor $C_{LS}$ to output locus 38. Current $I_{LS}$ is selected to effect an appropriate voltage drop across resistor $R_{LS}$ so that a desired potential is present at output locus 38, with respect to ground 41. Accordingly, information indicating signal variations are included in an output signal at output locus 38 that is referenced to ground.

There are problems with prior art level shifting apparatus 30. Unless one wishes to fabricate apparatus 30 using expensive precision parts, control over the potential at output locus 38 is unacceptably imprecise during operation of apparatus 30. Even using precision parts, control over the potential at output locus 38 is an issue. This is so because of the practical reason that several variances are commonly experienced by apparatus 30 during operation including variations in supply voltage $V_{CC}$, variances in base current through base 42 of transistor $Q_3$, and temperature and process variations from unit to unit during manufacture of apparatus 30.

Further challenges in producing apparatus 30 with sufficient precision of operation occur because customer users often specify that input signals provided at input terminals 50, 52 will be less than $V_{CC}$, as indicated by resistors $R_1$, $R_2$. In order to drop sufficient voltage across resistor $R_{LS}$ to achieve desired potential at output locus 38, current $I_{LS}$ must be at a level that ensures apparatus 30 requires too much power for today's low voltage, low power products. Resistor $R_{LS}$ may be increased in size to reduce the amount of current $I_{LS}$ required. However, the amount that resistor $R_{LS}$ must be increased to sufficiently compensate for the power-contributing effect of current $I_{LS}$ would render resistor $R_{LS}$ unacceptably large. The purpose of capacitor $C_{LS}$ is intended to provide a bypass path for AC (alternating current) signals around resistor $R_{LS}$ to thereby provide a good drive signal for application to the input of transistor $Q_3$. Driving a bipolar transistor, such as transistor $Q_3$ involves driving a significant amount of capacitance (inherent in the capacitor), and that capacitance limits the speed of the apparatus. The problem with making resistance $R_{LS}$ large to reduce the amount of current $I_{LS}$ required is that doing so makes small variations of input DC current into transistor $Q_3$ cause large variations of DC output level from transistor $Q_3$. This relatively large variance in DC output level upsets the operating point of transistor $Q_3$.

Figure 3:
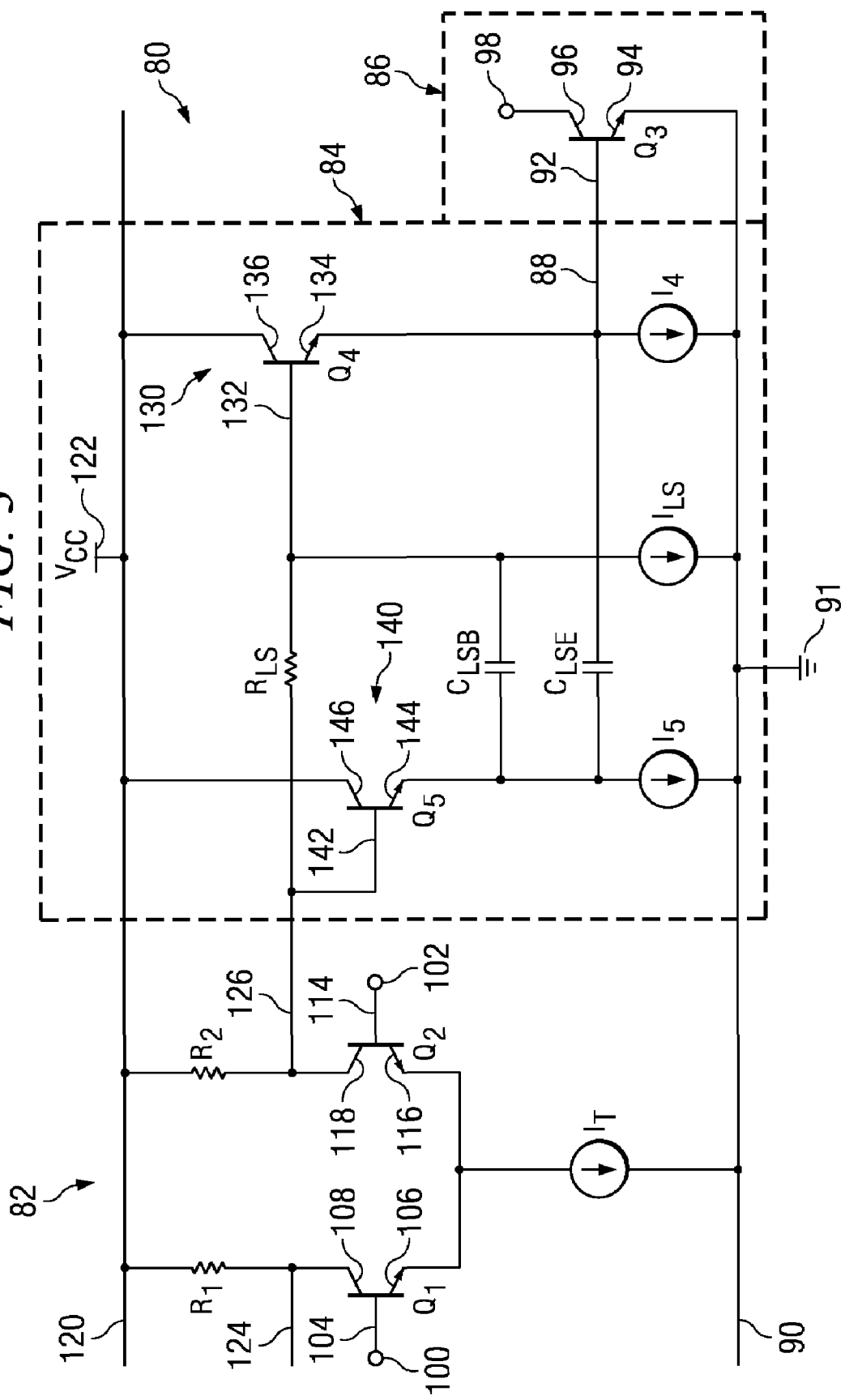
FIG. 3 is an electrical schematic diagram of a level-shifting apparatus configured according to the present invention.

FIG. 3 is an electrical schematic diagram of a level-shifting apparatus configured according to the present invention. In FIG. 3, a level-shifting apparatus 80 includes an input section 82, a level shift section 84 and an output section 86. Signals appearing at an output locus 88 are referenced to ground and precisely controlled. Output section 86 may contain any appropriate interface structure for connecting with downstream portions of a communication system. In FIG. 3, output section 86 is representatively illustrated, by way of example and not by way of limitation, as including an NPN bipolar transistor $Q_3$ having a base 92 coupled with output locus 88, an emitter 94 coupled with ground 91 via a lower rail 90 and a collector 96 coupled with an output interface terminal 98 for connecting with downstream portions of a communication system (not shown in FIG. 3).

Differential signaling input signals are received by input section 82 from an upstream data source (not shown in FIG. 3; e.g., data source 12; FIG. 1) at input terminals 100,102. Input terminal 100 is coupled with an NPN bipolar transistor $Q_1$ at its base 104. Transistor $Q_1$ has an emitter 106 and a collector 108. Input terminal 102 is coupled with an NPN bipolar transistor $Q_2$ at its base 114. Transistor $Q_2$ has an emitter 116 and a collector 118. Collector 108 is coupled with an upper rail 120 via a resistor $R_1$. Collector 118 is coupled with upper rail 120 via a resistor $R_2$. Upper rail 120 is coupled with a voltage supply locus 122 providing a supply voltage $V_{cc}$. Emitters 104,114 are coupled with ground 91 via a current source $I_T$ and lower rail 90. Input section 82 presents output signals at output leads 124, 126.

In the interest of simplifying FIG. 3, apparatus 80 is shown configured for single-ended signaling so that only one side of signaling structure is included in apparatus 80. That is, level shift section 84 and output section 86 are only associated with output lead 126. A similar structure to level shift section 84 and output section 86 would also be coupled with output lead 124 for effecting fully differential signaling using apparatus 80. Operation of the output section and level shift section associated with output lead 124 (not shown in FIG. 3) is substantially identical with operation of output section 86 and level shift section 84 illustrated in coupled relation with output lead 126 and described below.

Level shift section 84 includes a low speed network 130 and a high speed network 140. Networks 130, 140 are coupled substantially in parallel between output lead 126 and output locus 88.

Low speed network 130 includes a resistor $R_{LS}$, a transistor $Q_4$ and current sources $I_{LS}$, $I_4$. Transistor $Q_4$ has a base 132, an emitter 134 and a collector 136. Base 132 is coupled with resistor $R_{LS}$. Collector 136 is coupled with upper rail 120. Emitter 134 is coupled with current source $I_4$ and with output locus 88. Current source $I_4$ is coupled between output locus 88 and lower rail 90.

High speed network 140 includes a transistor $Q_5$, a current source $I_5$ and capacitors $C_{LSB}$, $C_{LSE}$. Transistor $Q_5$ has a base 142, an emitter 144 and a collector 146. Base 142 is coupled with output lead 126. Collector 146 is coupled with upper rail 120. Emitter 144 is coupled with lower rail 90 via current source $I_5$.

Current source $I_{LS}$ is coupled between lower rail 90 and base 132 of transistor $Q_4$. Capacitor $C_{LSB}$ couples emitter 144 of transistor $Q_5$ with base 132 of transistor $Q_4$. Capacitor $C_{LSE}$ couples emitter 144 with output locus 88.

Low speed network 130 operates as a level setting signal path to set the DC (direct current) level at output locus 88 to a desired level. Emitter 134 of transistor $Q_4$ sets DC bias level at output locus 88. An important difference in level-shifting apparatus 80 as compared with apparatus 30 (FIG. 2) is that low speed network 130 includes an active component $Q_4$. The term "active component" or "active element" is used in this context to indicate a component that operates as an amplifying device, including an amplifier having unity gain. Apparatus 30 relies solely upon resistor $R_{LS}$ to set DC output resistance at output locus 38 (FIG. 2). In contrast, level-shifting apparatus 80 (FIG. 3) employs an active component to set output DC resistance at output locus 80. In the preferred embodiment of the invention illustrated in FIG. 3, level-shifting circuit 80 employs active component transistor $Q_4$ configured as an emitter-follower to establish a lower DC output resistance at output locus 88 than can be established using resistor $R_{LS}$ alone (as in prior art apparatus 30; FIG. 2). Transistor $Q_4$ acts as a buffer in low speed network 130 and assures that a low DC output resistance is established at output locus 88. Establishing such a low DC output resistance at output locus 88 is advantageous because variations in DC current drain at output locus 88 (e.g., when β of transistor $Q_3$ drifts with process or temperature) causes minimal drift in the DC output level at output locus 88.

High speed network 140 operates as a signal transition path to speed up provision of signal transitions (e.g., information bearing signal transitions) to output locus 88. By driving base 142 of transistor $Q_5$ without a resistor in series the usual low pass filter (LPF) effect of driving a resistor in series with a capacitor (capacitance at input of a transistor) is avoided and high speed network 140 can achieve a faster operating speed without using significant amounts of power.

Transistor $Q_4$ operates at slow speed to set the DC bias at output locus 88. Transistor $Q_4$ operates at slow speed because of the low pass filter (LPF) effect effected by resistor $R_{LS}$ coupled in series with the capacitance of transistor $Q_4$. Coupling capacitor $C_{LSB}$ between emitter 144 and base 132 keeps base 132 in synchrony with emitter 144. Capacitor $C_{LSB}$ precharges base 132 (almost instantaneously) to the level which base 132 will eventually reach as the signal presented at output lead 126 varies. If a long interval of the same signal level (e.g., a long series of "1's") is applied to base 132, there can be a charge build up at base 132. Capacitor $C_{LSB}$ repeatedly sets the level of base 132 where it should be and thereby operates to deny build up of charge at base 132.

Emitter 144 is also coupled with emitter 134 via capacitor $C_{LSE}$ and is therefore in synchrony with emitter 144. The result is that capacitors $C_{LSB}$, $C_{LSE}$ cooperate to keep base 132 in synchrony with emitter 134 of transistor $Q_4$. An important consequence of this synchrony is that the $V_{BE}$ (base to emitter voltage) of transistor $Q_4$ does not change so that the current through transistor $Q_4$ is constant. High speed network 140 and capacitors $C_{LSB}$, $C_{LSE}$ ensure that base 132 and emitter 134 of capacitor $Q_4$ track together to assure a constant $V_{BE}$ in transistor $Q_4$ which in turn assures there is constant current through transistor $Q_4$.

Current source $I_{LS}$ is coupled with resistor $R_{LS}$. Current source $I_{LS}$ draws current though resistor $R_{LS}$ to effect a voltage drop across resistor $R_{LS}$ and $V_{BE}$ (base-to-emitter voltage) drop across transistor $Q_4$ appropriate to establish the desired voltage (referenced to ground 91) at output locus 88. It is important that the value of current $I_{LS}$ is properly and precisely maintained to establish the correct voltage drop across resistor $R_{LS}$. For example, if supply voltage $V_{CC}$ varies, current $I_{LS}$ must be varied to change the voltage drop across resistor $R_{LS}$ so that the total voltage drop across resistor $R_{LS}$ plus $V_{BE}$ of transistor $Q_4$ will still yield the proper DC bias level at output locus 88.

Figure 4:
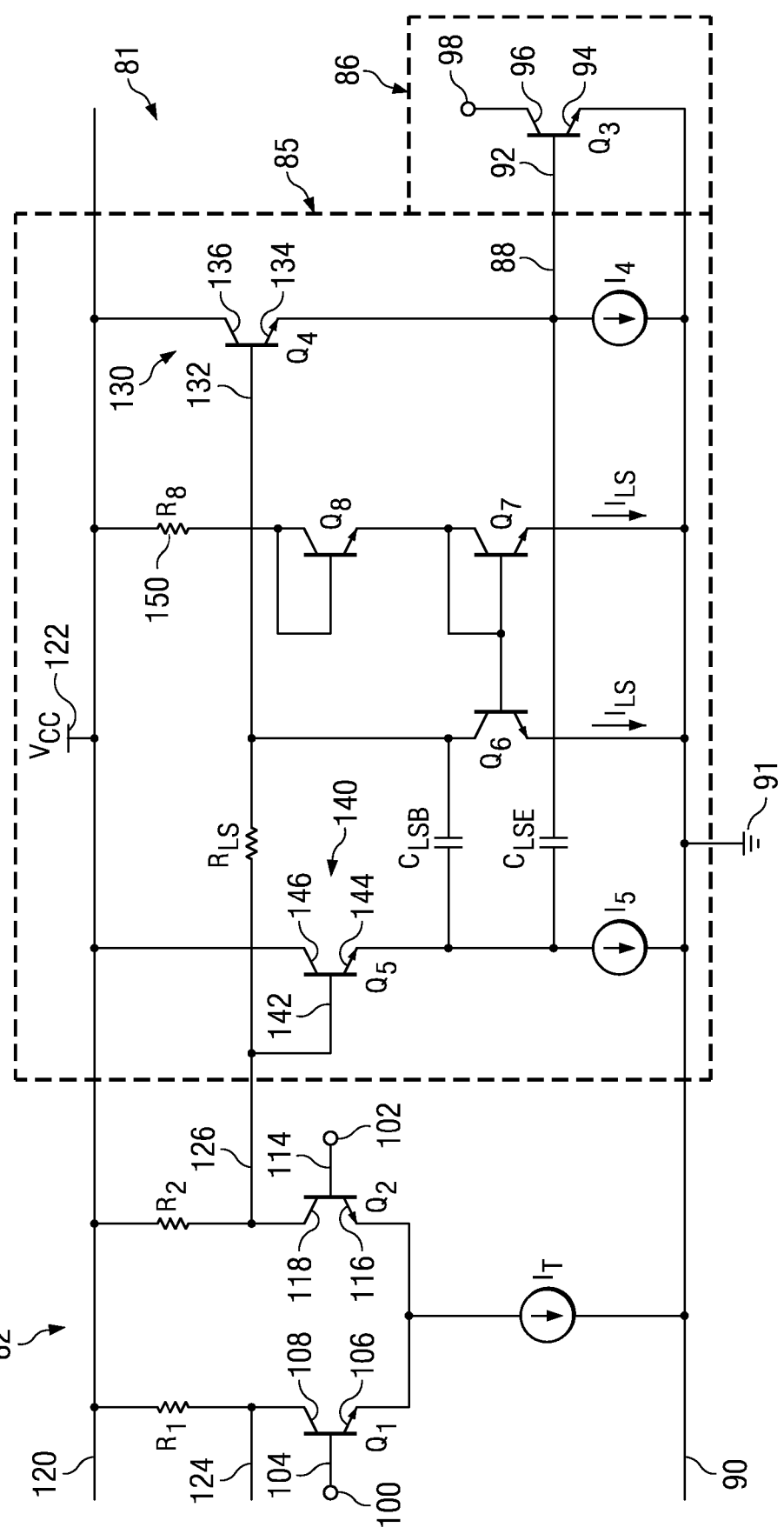
FIG. 4 is an electrical schematic diagram of the preferred embodiment of the level-shifting apparatus of the present invention.

The preferred embodiment of the present invention, illustrated in FIG. 4, provides for automatically establishing proper current $I_{LS}$ as various conditions change in the level shifting apparatus.

FIG. 4 is an electrical schematic diagram of the preferred embodiment of the level-shifting apparatus of the present invention. In FIG. 4, a level-shifting apparatus 81 includes an input section 82, a level shift section 85 and an output section 86. Many structural features of apparatus 81 are substantially the same as similar features provided in apparatus 80 (FIG. 3). In the interest of avoiding confusion, elements in apparatus 81 that are substantially the same as elements in apparatus 80 (FIG. 3) will be described using the same reference numerals.

Signals appearing at an output locus 88 are referenced to ground and precisely controlled. Output section 86 may contain any appropriate interface structure for connecting with downstream portions of a communication system. In FIG. 4, output section 86 is representatively illustrated, by way of example and not by way of limitation, as including an NPN bipolar transistor $Q_3$ having a base 92 coupled with output locus 88, an emitter 94 coupled with ground 91 via a lower rail 90 and a collector 96 coupled with an output interface terminal 98 for connecting with downstream portions of a communication system (not shown in FIG. 4).

Differential signaling input signals are received by input section 82 from an upstream data source (not shown in FIG. 4; e.g., data source 12; FIG. 1) at input terminals 100, 102. Input terminal 100 is coupled with an NPN bipolar transistor $Q_1$ at its base 104. Transistor $Q_1$ has an emitter 106 and a collector 108. Input terminal 102 is coupled with an NPN bipolar transistor $Q_2$ at its base 114. Transistor $Q_1$ has an emitter 116 and a collector 118. Collector 108 is coupled with an upper rail 120 via a resistor $R_1$. Collector 118 is coupled with upper rail 120 via a resistor $R_2$. Upper rail 120 is coupled with a voltage supply locus 122 providing a supply voltage $V_{CC}$. Emitters 104, 114 are coupled with ground 91 via a current source $I_T$ and lower rail 90. Input section 82 presents output signals at output leads 124, 126.

In the interest of simplifying FIG. 4, apparatus 81 is sown configured for single-ended so that only one side of signaling structure is included in apparatus 81. That is, level shift section 85 and output section 86 are only associated with output lead 126. A similar structure to level shift section 85 and output section 86 would also be coupled with output lead 124 for effecting fully differential signaling using apparatus 81. Operation of the output section and level shift section associated with output lead 124 (not shown in FIG. 4) is substantially identical with operation of output section 86 and level shift section 85 illustrated in coupled relation with output lead 126 and described below.

Level shift section 85 includes a low speed network 130 and a high speed network 140. Networks 130, 140 are coupled substantially in parallel between output lead 126 and output locus 88.

Low speed network 130 includes a resistor $R_{LS}$, a transistor $Q_4$ and current sources $I_{LS}$, $I_4$. Transistor $Q_4$ has a base 132, an emitter 134 and a collector 136. Base 132 is coupled with resistor $R_{LS}$. Collector 136 is coupled with upper rail 120. Emitter 134 is coupled with current source $I_4$ and with output locus 88. Current source $I_4$ is coupled between output locus 88 and lower rail 90.

High speed network 140 includes a transistor $Q_5$, a current source $I_5$ and capacitors $C_{LSB}$, $C_{LSE}$. Transistor $Q_5$ has a base 142, an emitter 144 and a collector 146. Base 142 is coupled with output lead 126. Collector 146 is coupled with upper rail 120. Emitter 144 is coupled with lower rail 90 via current source $I_5$.

Capacitor $C_{LSB}$ couples emitter 144 of transistor $Q_5$ with base 132 of transistor $Q_4$. Capacitor $C_{LSE}$ couples emitter 144 with output locus 88.

Low speed network 130 operates as a level setting signal path to set the DC (direct current) level at output locus 88 to a desired level. Emitter 134 of transistor $Q_4$ sets DC bias level at output locus 88. High speed network 140 operates as a signal transition path to speed up provision of signal transitions (e.g., information bearing signal transitions) to output locus 88. By driving base 142 of transistor $Q_5$ without a resistor in series the usual low pass filter (LPF) effect of driving a resistor in series with a capacitor (capacitance at input of a transistor) is avoided and high speed network 140 can achieve a faster operating speed.

Transistor $Q_4$ operates at slow speed to set the DC bias at output locus 88. Transistor $Q_4$ operates at slow speed because of the low pass filter (LPF) effect effected by resistor $R_{LS}$ coupled in series with the capacitance of transistor $Q_4$. Coupling capacitor $C_{LSB}$ between emitter 144 and base 132 keeps base 132 in synchrony with emitter 144. Capacitor $C_{LSB}$ precharges base 132 (almost instantaneously) to the level which base 132 will eventually reach as the signal presented at output lead 126 varies. If a long interval of the same signal level (e.g., a long series of "1's") is applied to base 132, there could be a charge build up at base 132. Capacitor $C_{LSB}$ repeatedly sets the level of base 132 where it should be and thereby operates to deny build up of charge at base 132.

Emitter 144 is also coupled with emitter 134 via capacitor $C_{LSE}$ and is therefore in synchrony with emitter 144. The result is that capacitors $C_{LSB}$, $C_{LSE}$ cooperate to keep base 132 in synchrony with emitter 134 of transistor $Q_4$. An important consequence of this synchrony is that the $V_{BE}$ (base to emitter voltage) of transistor $Q_4$ does not change so that the current through transistor $Q_4$ is constant. High speed network 140 and capacitors $C_{LSB}$, $C_{LSE}$ ensure that base 132 and emitter 134 of capacitor $Q_4$ track together to assure a constant $V_{BE}$ in transistor $Q_4$ which in turn assures there is constant current through transistor $Q_4$.

Level shift section 85 also includes a replica or modeling network 150. Modeling network 150 replicates or models low speed network 130. Modeling network 150 may be configured in a size similar to low speed network 130 to replicate low speed network in a substantially 1:1 copy. Preferably modeling network 150 is configured in a much smaller scale model version of low speed network 130 to save power. Modeling network 150 includes a resistor $R_8$ coupled in series with transistors $Q_7$, $Q_8$ between upper rail 120 and lower rail 90. Modeling network 150 also includes a transistor $Q_6$ coupled between base 132 of transistor $Q_4$ and lower rail 90. Transistors $Q_6$, $Q_7$ are coupled to establish a current mirror so that current $I_{LS}$ traversing transistor $Q_7$ is mirrored in transistor $Q_6$. In the preferred embodiment illustrated in FIG. 4, resistor $R_8$ replicates or models resistor $R_{LS}$, transistor $Q_8$ replicates or models transistor $Q_4$ and transistor $Q_7$ replicates or models a voltage drop desired between output locus 88 and lower rail 90 (i.e., ground 91). Current $I_{LS}$ is mirrored in transistor $Q_6$ from transistor $Q_7$ and is applied by transistor $Q_6$ to base 132 of transistor $Q_4$. Current $I_{LS}$ is precisely and dynamically controlled by network 150 as apparatus 81 operates.

Respective voltage drops across transistors $Q_7$, $Q_8$ generally remain substantially unchanged. When supply voltage $V_{CC}$ varies, voltage drop between upper rail 120 and lower rail 90 (rail-to-rail voltage drop) changes. Variance in rail-to-rail voltage drop is accommodated by a change in voltage drop across resistor $R_8$. Change in voltage drop across resistor $R_8$ is effected by change in current $I_{LS}$. That is, the rail-to-rail voltage drop is substantially fixed across network 150. Respective voltage drops are substantially fixed across certain individual components (e.g., transistors $Q_7$, $Q_8$) except across resistor $R_8$.

If supply voltage $V_{CC}$ varies toward a lesser value, for example, then rail-to-rail voltage is reduced. However, voltage drop across transistors $Q_7$, $Q_8$ is substantially unchanged, so the lesser rail-to-rail voltage drop is effected by lowering current $I_{LS}$ to establish a lesser voltage drop across resistor $R_8$. Because of the resulting lower voltage drop across resistor $R_8$, a lower overall rail-to-rail voltage drop is established. If supply voltage $V_{CC}$ varies toward a higher value, for example, then rail-to-rail voltage is increased. However, voltage drop across transistors $Q_7$, $Q_8$ is substantially unchanged, so the greater rail-to-rail voltage drop is effected by raising current $I_{LS}$ to establish a greater voltage drop across resistor $R_8$. Because of the resulting greater voltage drop across resistor $R_8$, a greater overall rail-to-rail voltage drop is established. Such automatic adjustment of current $I_{LS}$ therefore establishes a substantially unchanging voltage with respect to ground 91 at output locus 88.

It is known by those skilled in the art that deterministic jitter in output signals is a common result of variations in supply voltage $V_{CC}$. The capability of the present invention to dynamically accommodate variations in supply voltage $V_{CC}$ is especially useful in avoiding deterministic jitter in output signals presented at output locus 88.

Process differences are substantially avoided between networks 130, 150 because all components of apparatus 81 are fabricated together on a single substrate, so processing changes will affect all similar components in apparatus 81 in similar fashion. Similarly, temperature variances will affect all similar components similarly because all components in apparatus 81 are co-located on a single substrate within a single housing or cabinet. Stated another way, because networks 130, 150 are fabricated together on a single substrate and are co-located in a single housing or cabinet, networks 130, 150 will track together and thereby minimize differences between networks 130, 150 attributable to process or temperature variations. This tracking together also substantially accommodates any changes in $V_{BE}$ that may occur in some circumstances between any given transistor and its replica or model transistor (i.e., between transistors $Q_4$, $Q_8$ or between transistors $Q_3$, $Q_7$—if transistor $Q_3$ is used in output section 86).

Figure 5:
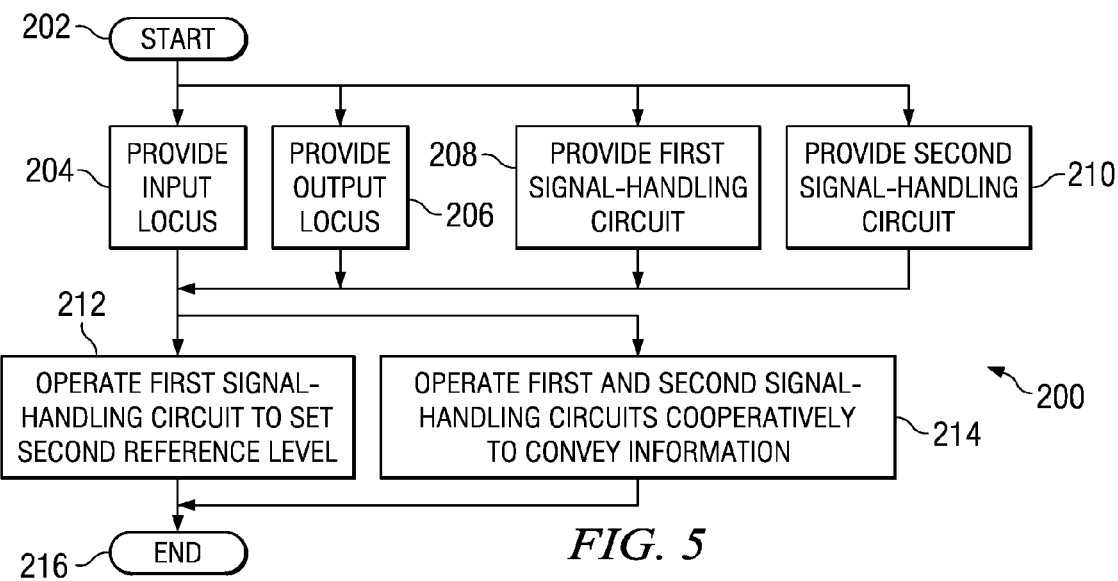
FIG. 5 is a flow diagram illustrating the method of the present invention.

FIG. 5 is a flow diagram illustrating the method of the present invention. In FIG. 5, a method 200 for shifting a received signal at a first reference level to an output signal at a second reference level; the received signal including information-indicating signal values; begins at a START locus 202. Method 200 continues with the step of (a) in no particular order: (1) providing an input locus for receiving the received signal, as indicated by a block 204; (2) providing an output locus for presenting the output signal, as indicated by a block 206; (3) providing a first signal-handling circuit coupled with the input locus and with the output locus, as indicated by a block 208; and (4) providing a second signal-handling circuit coupled with the input locus and with the first signal-handling circuit, as indicated by a block 210.

Method 200 continues with the step of (b) in no particular order: (1) operating the first signal-handling circuit to set the second reference level at the output locus, as indicated by a block 212; and (2) operating the first signal-handling circuit and the second signal-handling circuit cooperatively to convey the information-indicating signal values from the input locus to the output locus, as indicated by a block 214. Method 200 terminates at an END locus 216.

It is to be understood that, while the detailed drawings and specific examples given describe preferred embodiments of the invention, they are for the purpose of illustration only, that the apparatus and method of the invention are not limited to the precise details and conditions disclosed and that various changes may be made therein without departing from the spirit of the invention which is defined by the following claims:

We claim:

1. An apparatus for shifting a received signal modulated relative to a first reference voltage level to an output signal modulated relative at a second reference voltage level, comprising:
    a first network and a second network coupled substantially in parallel between an input and an output, the first network including:
    a resistor coupled to the input;
    a first transistor having a control electrode coupled to the resistor, and
    other electrodes coupled between first and second voltage sources;
    a first current source coupled between the first transistor control electrode and one of the first and second voltage sources; and
    a second current source coupled between one of the first transistor other electrodes and one of the first and second voltage sources, the second network including:
    a second transistor having a control electrode coupled to the input, and other electrodes coupled between the first and second voltage sources;
    a first capacitor coupled between one of the second transistor other electrodes and the first transistor control electrode;
    a second capacitor coupled between one of the second transistor other electrodes and the output; and
    a third current source coupled between one of the second transistor other electrodes and one of the first and second voltage sources.

2. The apparatus of claim 1, wherein the first network is a low speed network, and the second network is a high speed network.

3. The apparatus of claim 1, wherein the first current source is coupled between the first transistor control electrode and the second voltage source; the second current source is coupled between one of the first transistor other electrodes and the second voltage source; the first and second capacitors are coupled to each other and to the same one of the second transistor other electrodes; and the third current source is coupled between the same one of the second transistor other electrodes and the second voltage source.

4. The apparatus of claim 3, wherein the first transistor comprises a first NPN transistor having a base coupled to the resistor, a collector coupled to the first voltage source, and an emitter coupled to the second voltage source through the second current source; and the second transistor comprises a second NPN transistor having a base coupled to the input, a collector coupled to the first voltage source, and an emitter coupled to the second voltage source through the third current source.

5. The apparatus of claim 4, wherein the first voltage source is a source of voltage greater than ground, and the second voltage source is ground.

6. The apparatus of claim 4, further comprising a second resistor coupled to the first voltage source, and a third transistor coupled between the second resistor and the first current source.

7. The apparatus of claim 6, wherein the third transistor is a third NPN transistor having a base, a collector coupled to the resistor and to the third transistor base, and an emitter coupled to the first current source.

8. The apparatus of claim 7, wherein the first current source comprises at least one fourth NPN transistor coupled between the first resistor and the second voltage source, and at least one fifth NPN transistor coupled between the third NPN transistor and the second voltage source, the at least one fourth and at least one fifth NPN transistors having their bases connected so that current flowing through the at least one fifth NPN transistor will be mirrored to flow through the at least one fourth NPN transistor.

9. The apparatus of claim 8, wherein the first voltage source is a source of voltage greater than ground, and the second voltage source is ground.

10. The apparatus of claim 1, further comprising a third network coupled between the first and second voltage sources that models the first network.

11. The apparatus of claim 1, further comprising a third network, comprising a second resistor coupled to the first voltage source, and a third transistor coupled between the second resistor and the first current source.

12. The apparatus of claim 11, wherein the third transistor is a third NPN transistor having a base, a collector coupled to the resistor and to the third transistor base, and an emitter coupled to the first current source.

13. The apparatus of claim 12, wherein the first current source comprises at least one fourth NPN transistor coupled between the first resistor and the second voltage source, and at least one fifth NPN transistor coupled between the third NPN transistor and the second voltage source, the at least one fourth and at least one fifth NPN transistors having their bases connected so that current flowing through the at least one fifth NPN transistor will be mirrored to flow through the at least one fourth NPN transistor.

14. An apparatus for shifting a received signal modulated relative to a first reference DC voltage level to an output signal modulated relative to a second DC reference voltage level, comprising:
- a first network having a resistor coupled to an input and having a first amplifier having an input electrode coupled to the resistor and an output electrode coupled to the output, wherein the first amplifier is responsive to a DC voltage set relative to the input by the resistor to set the second reference DC voltage level at an output; and
- a second network coupled to the input, substantially in parallel with the first network, having a second amplifier having an input electrode coupled to the input and an output electrode for transmitting received signal modulation information from the input to the output, and wherein the second network includes first and second capacitive elements coupled between the second amplifier output electrode and the first amplifier control electrode and output, respectively.

15. The apparatus of claim 14, wherein the first amplifier control electrode is coupled to a first current source for providing current through the resistor, the first amplifier output electrode is coupled to a second current source for providing current through the first amplifier, and the second amplifier is coupled to a third current source for providing current through the first amplifier.

16. The apparatus of claim 15, wherein the first current source includes a current mirror and a path that models the first network, for setting current through the current mirror.

17. An apparatus for shifting a received signal modulated relative to a first reference DC voltage level to an output signal modulated relative to a second DC reference voltage level, comprising:
- a first network for setting the DC reference voltage component at an output relative to the DC reference voltage component of the received signal, the first network including a resistor coupled to an input, a first current source connected to set current through the resistor, a first active element having a control electrode coupled to the resistor, and a second current source coupled to another electrode of the first active element for setting current through the first active element;
- a second network, coupled substantially in parallel with the first network, for transmitting the varying voltage component of the received signal from the input to the output; the second network including a second active element having a control electrode coupled to the input, a third current source coupled to another electrode of the second active element for setting current through the second active element, and a first capacitor coupled between the second active element and the output.

18. The apparatus of claim 17, wherein the second network comprises a second capacitor coupled between the second active element and the first active element control electrode.

19. The apparatus of claim 18, wherein the first current source includes a circuit that models the first network, for setting current through the resistor.

20. A method for shifting a received signal modulated relative to a first reference DC voltage level to an output signal modulated relative to a second DC reference voltage level, comprising:
- setting the DC reference voltage component of the output signal based on the DC reference voltage component of the received signal, using a first network comprising a resistor coupled to an input, a first current source connected to set current through the resistor, a first active element having a control electrode coupled to the resistor, and a second current source coupled to another electrode of the first active element for setting current through the first active element;
- setting the varying voltage component of the output signal based on the varying voltage component of the received signal, using a second network, coupled substantially in parallel with the first network; the second network comprising a second active element having a control electrode coupled to the input, a third current source coupled to another electrode of the second active element for setting current through the second active element, and at least one capacitive element coupled between the second active element and the output.

21. The method of claim 20, wherein the first and second active elements are transistors; wherein the second network comprises a capacitive element coupled between the second active element and the first active element control electrode; and further comprising maintaining constancy of a control-to another electrode bias for the first active element, through the coupling of the capacitive elements.

* * * * *